United States Patent
Zarkesh-Ha et al.

(10) Patent No.: US 7,376,918 B2
(45) Date of Patent: May 20, 2008

(54) PROBABILISTIC NOISE ANALYSIS

(75) Inventors: Payman Zarkesh-Ha, Fremont, CA (US); Sandeep Bhutani, Pleasanton, CA (US); Weiqing Guo, Cupertino, CA (US)

(73) Assignee: LSI Corporation, Milpitas, CA (US)

(*) Notice: Subject to any disclaimer, the term of this patent is extended or adjusted under 35 U.S.C. 154(b) by 418 days.

(21) Appl. No.: 11/079,017

(22) Filed: Mar. 11, 2005

(65) Prior Publication Data
US 2006/0206843 A1 Sep. 14, 2006

(51) Int. Cl.
*G06F 17/50* (2006.01)
(52) U.S. Cl. .............................. 716/5; 716/4
(58) Field of Classification Search ............ 716/5
See application file for complete search history.

(56) References Cited
U.S. PATENT DOCUMENTS

| | | | | |
|---|---|---|---|---|
| 5,568,395 A * | 10/1996 | Huang | ............................ | 716/4 |
| 7,093,223 B2 * | 8/2006 | Becer et al. | ................... | 716/13 |
| 7,146,588 B1 * | 12/2006 | Marathe et al. | ................ | 716/4 |

OTHER PUBLICATIONS

S. Vrudhula, et al., *Probabilistic Analysis of Interconnect Coupling Noise*, IEEE Transactions on Computer-Aided Design of Integrated Circuits and Systems, vol. 22, No. 9, Sep. 2003, pp. 1188-1203.

* cited by examiner

*Primary Examiner*—Jack Chiang
*Assistant Examiner*—Brandon Bowers
(74) *Attorney, Agent, or Firm*—Luedeka, Neely & Graham, P.C.

(57) ABSTRACT

A method of determining whether voltage from an aggressor net exceeds a voltage threshold on a victim net design in an integrated circuit design. Probabilistic noise from the aggressor net on the victim net is calculated. The probabilistic noise is checked against the voltage threshold, and the victim net design is passed when the probabilistic noise does not exceed the voltage threshold. When the probabilistic noise does exceed the threshold, then an effective noise at a desired mean time to failure is computed, and the effective noise is checked against the voltage threshold. The victim net design is passed when the effective noise does not exceed the voltage threshold, and failed when the effective noise does exceed the threshold.

4 Claims, 4 Drawing Sheets

| Sample Net Name | Number of Aggressors | Peak Noise | Threshold | Effective Noise |
|---|---|---|---|---|
| Net 10 | 11 | 0.5257 | 0.45 | 0.3966 |
| Net 26 | 8 | 0.4948 | 0.45 | 0.4155 |
| Net 41 | 8 | 0.4885 | 0.45 | 0.3748 |
| Net 126 | 6 | 0.4505 | 0.45 | 0.4300 |
| Net 133 | 6 | 0.4547 | 0.45 | 0.4493 |
| Net 140 | 6 | 0.4517 | 0.45 | 0.4427 |
| Net 144 | 9 | 0.4531 | 0.45 | 0.3773 |

Fig. 7

PROBABILISTIC NOISE ANALYSIS

FIELD

This invention relates to the field of integrated circuit fabrication. More particularly, this invention relates to testing the designs of integrated circuits in regard to noise.

BACKGROUND

For every succeeding generation of integrated circuits, both transistor speed and transistor density has increased. To increase the transistor density, the metal line widths and spacing for the electrical interconnects have been reduced. The reduction of the spacing between the signal lines of an integrated circuit generally increases the capacitance between lines. This tends to make the lines noisier, as it is commonly called.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

When doing crosstalk or noise analysis, signal lines, also called nets, are identified as either victim nets or aggressor nets. The net being analyzed is considered the victim net, and those nets disposed adjacent to it, whether along its entire length or for just a portion of its length, are considered the aggressor nets. Nets that are not directly adjacent the victim net may also be considered as aggressor nets in the analysis of the victim net. The determination of what constitutes an aggressor net is outside of the scope of this discussion. When the analysis has been performed for a given victim net, then another net is selected as the new victim net, while the prior victim net may then be reclassified as an aggressor net, and the analysis is repeated for the new victim net.

The problem with such noise, and the importance of this type of analysis, continually increases as the voltage threshold for the active devices of integrated circuit is reduced, so as to speed up the integrated circuits. By lowering the voltage threshold of a transistor, and increasing the capacitance between nets, the probability increases that an amount of noise sufficient to switch the transistor state will be generated.

However, current noise analysis tools tend to be too pessimistic in their analysis, because they generally assumed that all aggressor nets will switch in the same direction, at the same time, and that their voltage peaks will be aligned. This results in a worst case maximum height composite noise waveform on the victim net. However, the number of aggressors that could have a significant amount of coupled noise to the victim net can often be quite large. In such a case, the likelihood of realizing a worst case composite noise, where all of the aggressor nets switch at exactly the same time, is very small. Because of the increasing complexity of integrated circuit designs, the problem of overestimating signal noise becomes more serious as the technology advances.

Two different general methods of noise analysis are typically used. The first is called a deterministic approach. In a deterministic approach, the noise waveform is estimated accurately by accounting for the logic and timing relationships between the aggressors and a victim. It is often necessary to perform static timing analysis and construct timing windows before this method of noise analysis can be performed. Although the incorporation of timing information in the noise analysis generally improves the accuracy of the noise estimation, it requires a very high computational effort.

The second method is called a probabilistic approach. In a probabilistic approach, it is assumed that the switching of the aggressor nets occurs randomly over a specific time interval within a clock period. Then the likelihood, or in other words the probability, that the total noise on a victim net will exceed a given threshold, such as the voltage threshold of a transistor on the victim net, is calculated. The mean time to failure is often used as a criterion to prioritize the jeopardy faced by victim nets that are subject to noise violation.

Unfortunately, the deterministic approach, as mentioned above, requires an extremely high computational effort, and therefore is not appropriate for a noise analysis of the entire integrated circuit. This leaves the probabilistic approach. However, there is no existing analytical model for probabilistic noise analysis, which makes it again computationally expensive.

An example of a probabilistic approach is presented in the paper *Probabilistic Analysis of Interconnect Coupling Noise*, by S. Vrudhula, et al., in the IEEE Transactions on Computer-Aided Design of Integrated Circuits and Systems, Vol. 22, No. 9, September 2003, pages 1188-1203. In that method, finding the mean time to failure for a given victim net requires an iterative search, which makes the method very slow and time consuming. Moreover, due to the lack of an analytical model, that method can only be used to computed the mean time to failure for a given noise threshold, and cannot compute the effective peak noise for a given mean time to failure.

What is needed, therefore, is a system that overcomes problems such as those described above, at least in part.

SUMMARY

The above and other needs are met by a method of determining an amount of noise on a victim net in an integrated circuit design, where the improvement is modeling the noise as a square wave. By modeling the noise as a square wave, the probabilistic calculations are simplified to a point where the threshold calculations for the victim net can be performed relatively rapidly, and can thus be applied to an entire integrated circuit without incurring too great a computational cost.

According to another aspect of the invention there is described a method of determining whether voltage from an aggressor net exceeds a voltage threshold on a victim net design in an integrated circuit design. Probabilistic noise from the aggressor net on the victim net is calculated. The probabilistic noise is checked against the voltage threshold, and the victim net design is passed when the probabilistic noise does not exceed the voltage threshold. When the probabilistic noise does exceed the threshold, then an effective noise at a desired mean time to failure is computed, and the effective noise is checked against the voltage threshold. The victim net design is passed when the effective noise does not exceed the voltage threshold, and failed when the effective noise does exceed the voltage threshold.

According to yet another aspect of the invention there is described a method of determining a victim net mean time to failure from aggressor net voltage spikes in an integrated circuit design. Probabilistic noise for the aggressor net is computed using an aggressor net voltage spike width and an aggressor net voltage spike height based on a square wave model of the aggressor net voltage spikes. A probability of failure of the victim net is computed, as well as a number of cycles to the failure of the victim net using the victim net cycle time. The mean time to failure for the victim net is then computed.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 7 is a table showing the computed peak noise and effective peak noise in some nets in a real integrated circuit.

DETAILED DESCRIPTION

Figure 1:
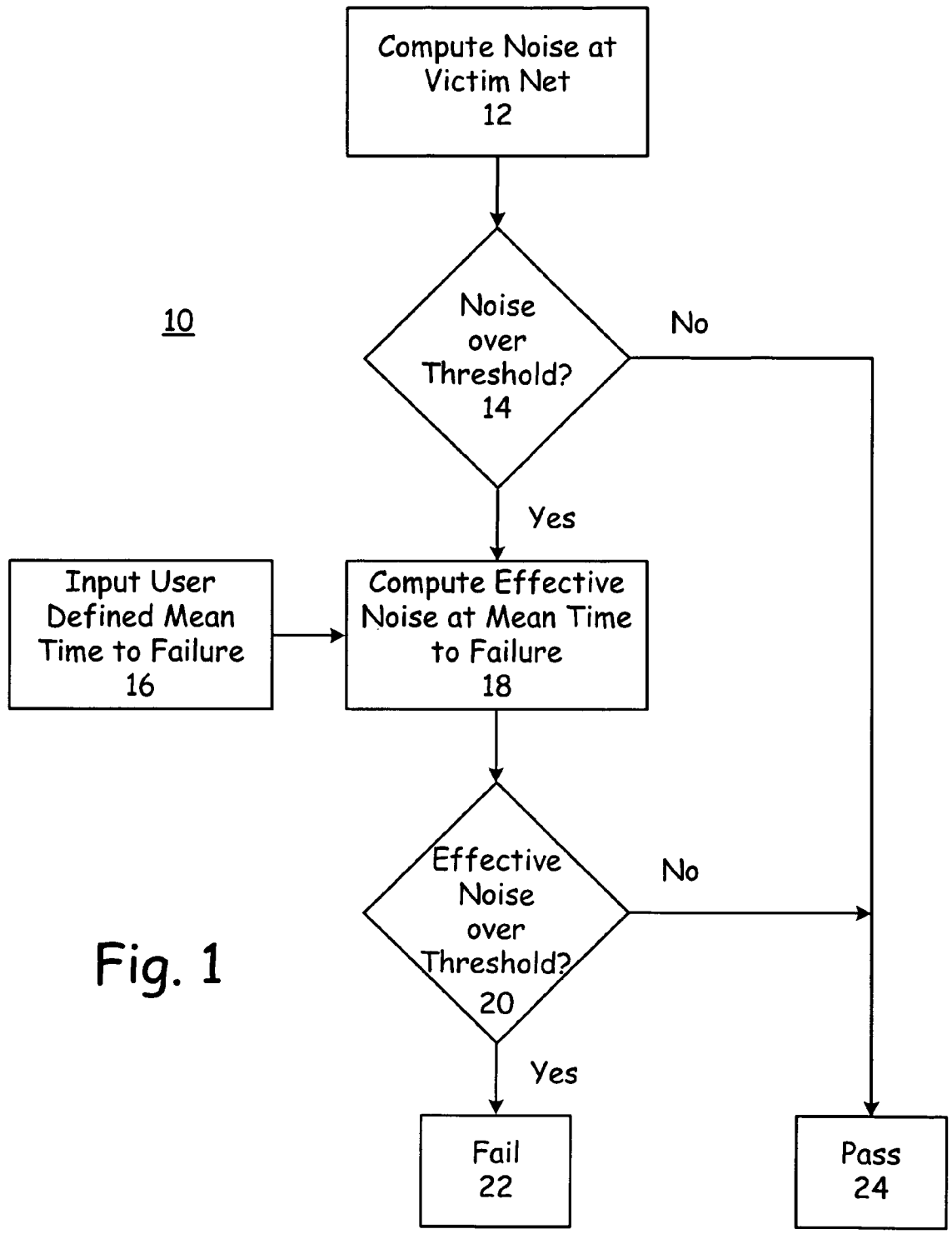
FIG. 1 is a flow chart of a noise analysis method according to a preferred embodiment of the present invention.

With reference now to FIG. 1 there is depicted a flow chart 10 of a noise analysis method according to a preferred embodiment of the present invention. As depicted in FIG. 1, the noise for a given victim net is computed, as given in block 12. The methods according to the present invention for computing this noise are described in more detail below. Determining which aggressor nets should be included in the analysis is outside of the scope of the present description. This noise value is a probabilistic value.

Once the noise from the aggressor nets has been calculated, it is compared to a noise threshold for the victim net, such as a voltage threshold for a transistor, as given in block 14. If the noise is not over the threshold, then the design for that victim net passes, as given in block 24, and analysis continues for the remaining victim nets, preferably until all candidate victim nets have been analyzed. Passing at this point indicates that the noise on the victim net would probably never exceed the threshold value.

If the computed probabilistic noise from the aggressor nets is over the threshold for the victim net, then another calculation is made to determine the effective noise at a desired mean time to failure, as given in block 18. The desired mean time to failure is an input value, as given in block 16. This value can be specified by a customer, or set in some other manner. The physical meaning of this specified mean time to failure is the length of time for which it is desired that the victim net under investigation would not experience a failure by receiving noise over its threshold limit. As mentioned above, the value calculated in block 12 is an indication of whether the noise on the victim net would ever exceed the threshold. The used defined mean time to failure value, as input in block 16, is a means to reduce the length of time from "forever" to some finite value that may be sufficient for the customer's needs.

According to the present invention, as described in more detail below, it is possible to then calculate the effective noise that the victim net could expect to receive during that specified mean time to failure. The ability to calculate this effective noise value is one of the many differences between the embodiments of the present invention and the prior art. For example, if the integrated circuit is intended to be used in a video game, the mean time to failure could be set to a relatively small value, such as ten years, because the anticipated life of the video game might be much less than that. However, the mean time to failure for an integrated circuit designed for military applications may need to be specified at about two hundred years or so, indicating a greater desire that the s probability of a failure of the integrated circuit over a fifty year lifetime of the system, for example, be reduced to a relatively low level. Even in that case, however, such a mean time to failure is much less than "forever."

Once the effective noise on the victim net has been computed, it is compared again to the threshold value for the victim net, as given in block 20. If the effective noise for the victim net is less than the threshold, then the design of the victim net is passed, as given in block 24, indicating that the victim net would probably not experience an amount of noise greater than the threshold value during the specified mean time to failure lifetime of the integrated circuit. If, however, the noise on the victim net is still greater than the threshold value, then the design of the victim net is failed, as given in block 22.

Figure 2:
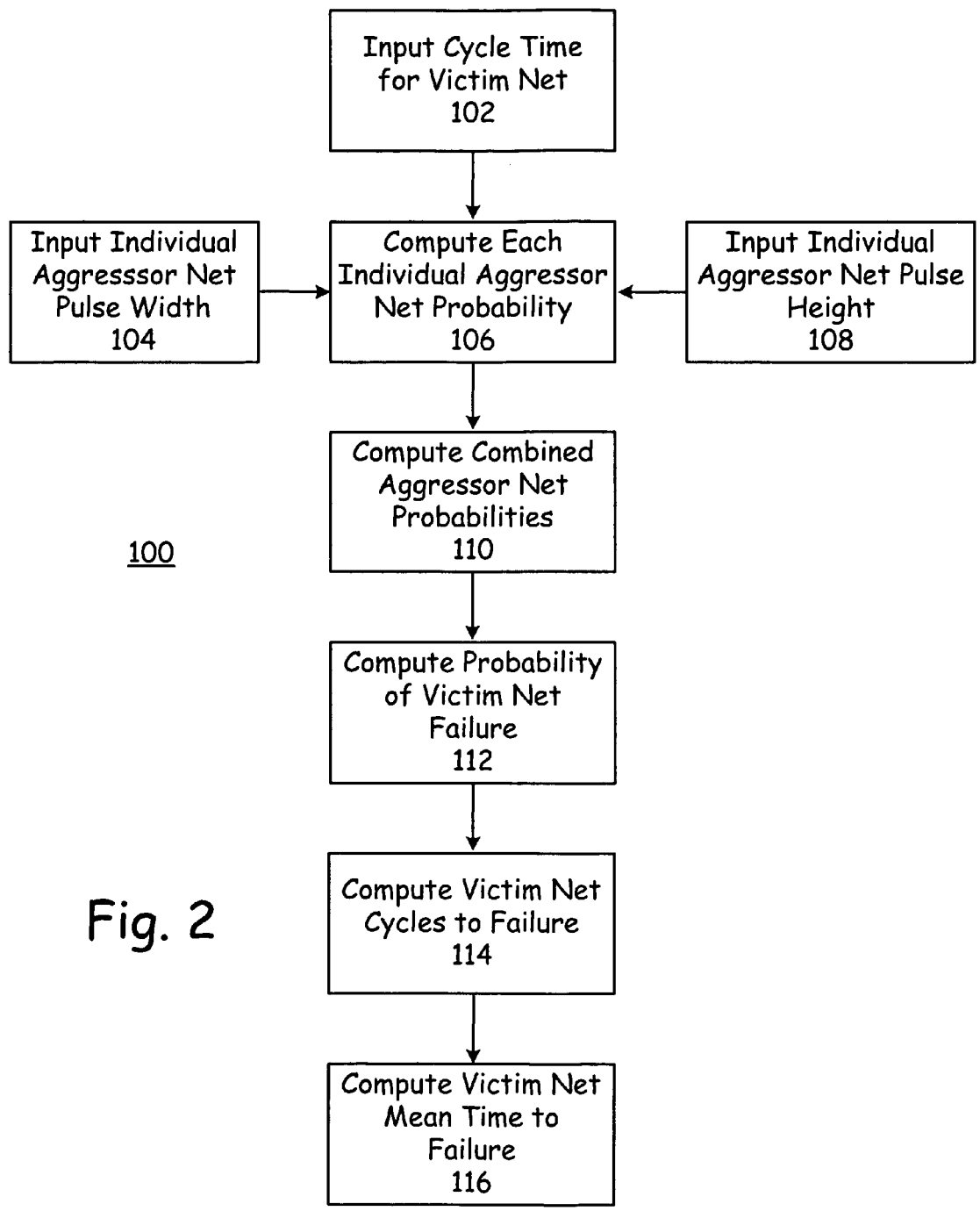
FIG. 2 is a flow chart of a noise computation method for a victim net according to a preferred embodiment of the present invention.

The method by which the noise from an aggressor net is computed is now described in reference to FIGS. 2 through 6. As depicted in FIG. 2, the cycle time T for the victim net is specified, as given in block 102. The cycle time T is a basis for further calculations as described below. The noise voltage probability is then computed for each individual aggressor net of the victim net, as given in block 106. For this calculation, the noise pulse width for each aggressor net is input, as given in block 104, and the noise pulse height for each aggressor net is input, as given in block 108.

Once the noise probability for each aggressor net is calculated, then the noise probability for the combination of all of the aggressor nets is computed, as given in block 110. This value can be used in block 12 of the method 10 described in regard to FIG. 1 above. However, additional analysis in this vein can also be performed. For example, the noise probability determined in block 110 can be used to compute the probability of the failure of the victim net, as given in block 112. From this, the number of cycles until probable failure of the victim net is computed, as given in block 114. Thereafter, the mean time to failure for the victim net can be computed, as given in block 116. This value indicates the length of time that the victim net would probably function, without experiencing a noise value that exceeded the threshold. As mentioned above, this value can be valuable, but in many cases it is more valuable to have the effective noise probability at a given mean time to failure value, as described above.

Figure 3:
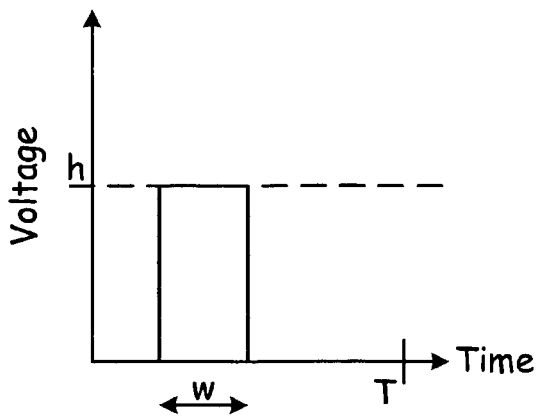
FIG. 3 is a chart depicting a noise pulse from an aggressor net on a victim net.

FIG. 3 depicts a chart representing a noise pulse from an aggressor net on a victim net, as an introduction to explaining the steps performed in block 106 of the method 100 as described in regard to FIG. 2. The noise pulse has a width w and voltage spike value h. This is charted against the cycle time T for the victim net. As depicted in FIG. 3, the cross talk noise from the aggressor net is preferably modeled as a square wave. In other words, it is assumed that the rise time of the noise is instantaneous, continues at a constant level for a given length of time, and then instantaneously falls back down to zero.

It is appreciated that modeling the noise as a square wave is novel, and one of the many distinctions between the methods of the present invention and the prior art, which tend to model noise as either saw tooth or triangular waves, having a rise time, a peak, and then a decay time. Although the square wave might not be the perfect model of the noise, the other shapes are not perfect models either, and compensation of variables such as the width or the height of the peak can be made to better approximate the noise.

However, because the square wave model assumes that the noise voltage lasts for a known period of time at a known value, it simplifies the calculations described herein, thereby reducing the computational load for the various embodiments of the method, and enabling their application to all candidate victim nets in an integrated circuit design.

Figure 4:
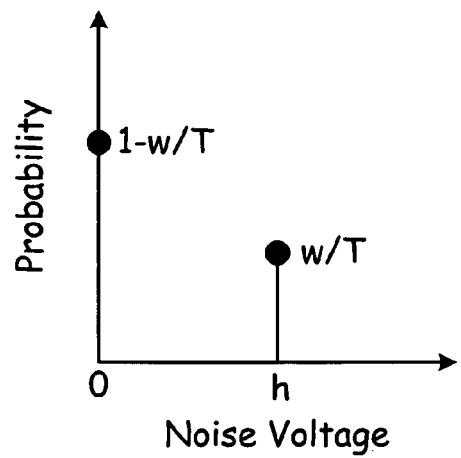
FIG. 4 is a chart depicting noise voltage probabilities on a victim net from the noise pulse of FIG. 3.

The voltage noise depicted in FIG. 3 can be transformed into a probabilistic noise as given in FIG. 4. Because of the shape of the square wave in FIG. 3, there are only two possible values for the noise voltage as given in FIG. 4, which two values are zero and h. The probability that the noise voltage is h at any given time is the time width w of the pulse divided by the cycle time T of the victim net, both as taken from the chart of FIG. 3. This probability is plotted on the chart of FIG. 4. The probability that the noise voltage is zero at any given time is one minus the probability that it is h, since there are only two states possible for the noise voltage. This is also plotted on the chart of FIG. 4. These calculations can be done for each of the aggressor nets, as a part of the computations referenced by block 106 in FIG. 2.

Figure 5:
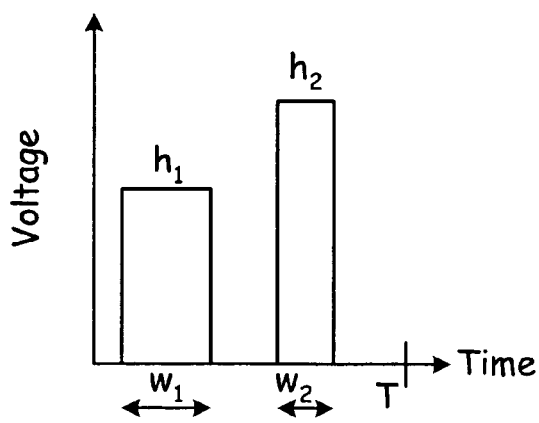
FIG. 5 is a chart depicting two noise pulses from two aggressor nets on a victim net.
Figure 6:
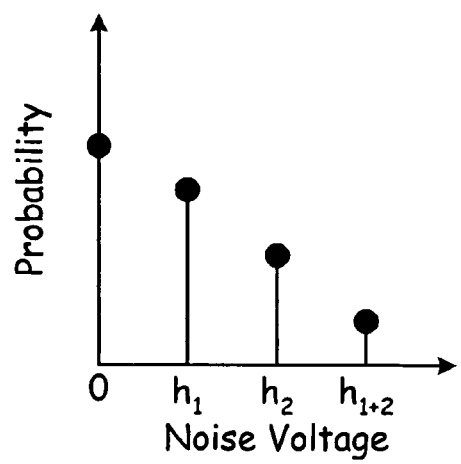
FIG. 6 is a chart depicting noise voltage probabilities on a victim net from the noise pulses of FIG. 5.

The combined effects from the various aggressor nets, as determined in block 110, can be determined as explained with reference to FIGS. 5 and 6. FIG. 5 depicts the noise pulses from two different aggressor nets, the first having a width $w_1$ and a height $h_1$, and the other having a width $w_2$ and a height $h_2$. The probability of the noise on the victim net being at a value $h_1$ is the probability that the first pulse hits and the second pulse does not, or $(w_1/T)[1-(w_2/T)]$. The probability of the noise on the victim net being at a value $h_2$ is similarly computed as the probability that the second pulse hits and the first pulse does not, or $(w_2/T)[1-(w_1/T)]$. The probability that the noise on the victim net is at a value $h_1+h_2$ is the probability that the first pulse and second pulse hit at overlapping times, which is $(w_1/T)(w_2/T)$. Finally, the probability that the noise on the victim net is zero is the probability that neither the first pulse nor the second pulse hits, which is $[1-(w_1/T)][1-(w_2/T)]$. These probabilities are plotted on the chart of FIG. 6.

The noise pulse might not occur in every clock cycle. The probability that a noise pulse occurs in a given clock cycle is called the activity factor. In most integrated circuit designs the activity factor ranges of from about ten percent to about twenty percent. The method by which the activity factor is computed for a given net is beyond the scope of this description. However, if the activity factor is available, it can be easily included in the analysis described herein. For example, if $a_1$ and $a_2$ are the activity factors of the aggressor nets described above, then the probability of the noise on the victim net being at a value $h_1$ is $a_1(w_1/T)[1-a_2(w_2/T)]$. The probability of the noise on the victim net being at a value $h_2$ is similarly computed as $a_2(w_2/T)[1-a_1(w_1/T)]$. The probability that the noise on the victim net is at a value $h_1+h_2$ is $a_1(w_1/T)a_2(w_2/T)$. Finally, the probability that the noise on the victim net is zero is $[1-a_1(w_1/T)][1-a_2(w_2/T)]$.

These interdependent values are computed by including calculations such as those described above for all of the aggressor nets, the number of which is typically no more than about ten or so. Thus, the computational load is not too great. The assumption in the calculations above is that there is an equal probability of a noise spike coming at any time during the cycle time of the victim net, and that the spikes from the various aggressor nets are all independent in their occurrence, one from another.

The probability of failure of a given victim net is given by the probability that the noise voltage is above the threshold voltage of the victim net. This can be computed by adding the probabilities associated with those noise voltages that are above the threshold voltage, as depicted in FIG. 6. This is the calculation performed in block 112 of FIG. 2. The mean number of cycles of the victim net prior to failure, as determined in block 114 of FIG. 2, is computed as the reciprocal of the probability of failure calculated in block 112. Finally, the mean time to failure for the victim, as determined in block 116 of FIG. 2, is computed as the number of cycles until failure, as computed in block 114, multiplied by the cycle time T of the victim net.

Now that the various calculations have been described, it is apparent how, instead of calculating a mean time to failure for a given victim net, the mean time to failure for a given victim net can be specified, and the computations can be done in reverse to determine the effective voltage noise that would probably exist within that mean time to failure. If the input mean time to failure is an acceptable value, and the effective noise is below the threshold, then this criterion can be newly used as the pass fail criteria for the victim net.

The method in this invention has been successfully used to characterize the noise probability in a real integrated circuit, as next described, where the chip clock frequency is 312 megahertz, the mean time to failure is five years, and the activity factor is ten percent. The probabilistic noise algorithm determined that out of 158 nets that reported noise violations, the probability of noise in twenty-four of those nets was so low that the integrated circuit would have to be continuously operated for more than five years before those nets were hit by a noise that would be large enough for them to fail.

Moreover, with the use of the preferred methods according to the present invention, the effective peak noise can be computed. FIG. 7 provides tabular data of some sample nets. The first column is the sample victim net name. The second column is the number of aggressors associated with the victim net. The third column is the peak noise on the victim net, assuming that the aggressor nets are perfectly aligned. Since the numbers in the third column are larger than the threshold voltage listed in the forth column, all of the victim nets are reported as violating nets. Assuming a desired mean time to failure of five years, the effective noise is computed as given above and listed in the fifth column. As shown in the fifth column, the effective noise is less than the voltage threshold as given in the forth column and, therefore, all the victim nets can be considered as safe nets, within the mean time to failure of five years.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of determining whether voltage from an aggressor net exceeds a voltage threshold on a victim net design in an integrated circuit design, when probability noise from the aggressor net exceeds the voltage threshold on the victim net, the method comprising the steps of:
   compute probabilistic noise from the aggressor net on the victim net,
   verify that the probabilistic noise exceeds the voltage threshold, noise at a desired mean time to failure,
   check the effective noise against the voltage threshold, and
   pass the victim net design when the effective noise does not exceed the voltage threshold.

2. The method of claim 1 wherein the probabilistic noise and effective noise are both modeled as square waves.

3. The method of claim 1, further comprising using an activity factor to compute the probabilistic noise.

4. The method of claim 1 wherein the probabilistic noise computation comprises:
   identify all possible aggressor nets,
   identify voltage spike heights associated with each of the aggressor nets,
   identify voltage spike widths associated with each of the aggressor nets,
   identify activity factors associated with each of the aggressor nets,
   determine all possible voltage spike height combinations of the aggressor nets, and
   calculate a probability of occurrence of each of the possible voltage level combinations using the voltage spike heights, widths, and activity factors.

* * * * *